(12) United States Patent
Manna et al.

(10) Patent No.: US 9,165,920 B2
(45) Date of Patent: Oct. 20, 2015

(54) TUNABLE PROTECTION SYSTEM FOR INTEGRATED CIRCUITS

(75) Inventors: Indrajit Manna, Singapore (SG); Hin Kiong Yap, Singapore (SG); Keng Foo Lo, Singapore (SG); Jae Soo Park, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1976 days.

(21) Appl. No.: 11/163,349

(22) Filed: Oct. 15, 2005

(65) Prior Publication Data

US 2007/0085142 A1 Apr. 19, 2007

(51) Int. Cl.
*H01L 29/66* (2006.01)
*H01L 23/62* (2006.01)
*H01L 29/02* (2006.01)
*H01L 29/06* (2006.01)
*H01L 23/58* (2006.01)
*H01L 27/02* (2006.01)

(52) U.S. Cl.
CPC ................ *H01L 27/0262* (2013.01)

(58) Field of Classification Search
USPC ......... 257/272, 273, 314, 358, 360, 362, 363, 257/173, 361, 487, 488, 489, 480, 481, 482, 257/483, 494, 495, 496, 175; 254/173
See application file for complete search history.

(56) References Cited

U.S. PATENT DOCUMENTS

| | | | |
|---|---|---|---|
| 5,751,042 A | 5/1998 | Yu | |
| 5,962,876 A * | 10/1999 | Yu | 257/133 |
| 6,066,879 A | 5/2000 | Lee et al. | |
| 6,285,062 B1 * | 9/2001 | Marr | 257/361 |
| 6,524,893 B2 * | 2/2003 | Kawazoe et al. | 438/133 |
| 6,646,309 B1 * | 11/2003 | Chen | 257/358 |
| 6,770,918 B2 * | 8/2004 | Russ et al. | 257/173 |
| 6,850,397 B2 | 2/2005 | Russ et al. | |
| 6,867,957 B1 | 3/2005 | Tong et al. | |
| 6,873,505 B2 | 3/2005 | Chen et al. | |
| 7,023,029 B1 * | 4/2006 | Vashchenko et al. | 257/173 |
| 7,136,268 B2 * | 11/2006 | Stricker et al. | 361/56 |

OTHER PUBLICATIONS

Vashchenko et al., "Implementation of 60V Tolerant Dual Direction ESD Protection in 5V BiCMOS Process for Automotive Application", EOS/ESD Symposium, 2004.
Schroder et al., "High voltage resistant ESD protection circuitry for 0.5 um CMOS OTP/EPROM programming pin", EOS/ESD Symposium, pp. 96-103.
Keppens et al., "ESD Protection Solutions for High Voltage Technologies", EOS/ESD Symposium, 2004.
Lee et al., "Novel ESD Protection Structure with Embedded SCR LDMOS for Smart Power Technology", 40th Annual International Reliability Physics Symposium, 2002, pp. 156-161.
Pendharkar et al., "SCR-LDMOS—A Novel LDMOS Device with ESD Robustness", The 12th International Symposium on Power Semiconductor Devices and IC's, May 2000, pp. 341-344, Toulouse, France.

* cited by examiner

*Primary Examiner* — Phat X Cao
*Assistant Examiner* — Diana C Vieira

(57) ABSTRACT

A tunable protection system including forming a tunable trigger device providing an adjustable protection activation level, forming a circuit protection device providing protection for integrated circuits, and electrically connecting the tunable trigger device and the circuit protection device to an input/output pad.

20 Claims, 3 Drawing Sheets

TUNABLE PROTECTION SYSTEM FOR INTEGRATED CIRCUITS

TECHNICAL FIELD

The present invention relates generally to protection device systems, and more particularly to a system for protecting integrated circuit devices from electrical transients, including electrostatic discharge (ESD) events.

BACKGROUND ART

Integrated circuit devices have been subject to increasing susceptibility to damage from the application of excessive voltages, for example, by electrostatic discharge (ESD) events. This susceptibility is due, in large part, to the decreasing gate oxide thicknesses, which have resulted as very large scale integration (VLSI) circuit geometries continue to shrink. In particular, during an ESD event, charge is transferred between one or more pins of the integrated circuit device and another conducting object, in a time period that is typically less than one microsecond. This charge transfer can generate voltages that are large enough to break down insulating films (e.g., gate oxides) on the integrated circuit device or can dissipate sufficient energy to cause electro-thermal failures in the integrated circuit device. Such failures include contact damage, silicon melting, or metal interconnect melting.

Bond pads on the integrated circuit die are electrically connected to the internal circuitry within the integrated circuit device. Even though the integrated circuit die is encapsulated with a protective material, these bond pads allow the integrated circuit die to be electrically exposed. Protection circuits are usually connected to all I/O bonding pads of an integrated circuit, to safely dissipate the energy associated with ESD events without causing any damage to the circuitry connected to the I/O pad. Protection circuits may also be connected to power supply pads or between power supply interconnect to prevent damage to internal circuits.

Modern consumer electronics including personal portable devices, such as cell phones, digital cameras, music players, PDA's, and location-based devices, require miniaturization as well as integration to fit shrinking physical spaces and increasing performance needs. The broad use of integrated circuit devices has made them particularly susceptible to unanticipated exposure and handling, and thus ESD exposure. ESD events, whether from humans, packaging or a system, are very dangerous to the very small integrated circuits that have become so very pervasive.

Numerous technologies have been developed to meet these requirements. Inadequate or improper protection levels have plagued many of these technologies such as grounded-gate, embedded junctions, and field oxide devices. These technologies have struggled with problems including large breakdown voltages, poor snapback performance, multi-finger turn-on, and increasing leakage.

Thus a need still remains for a protection system to ensure that the manufacturing methods provide increasing reliability and performance. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a tunable protection system including forming a tunable trigger device, the tunable trigger device providing an adjustable protection activation level, forming a circuit protection device, the circuit protection device providing protection for integrated circuits, and electrically connecting the tunable trigger device and the circuit protection device to an input/output pad.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
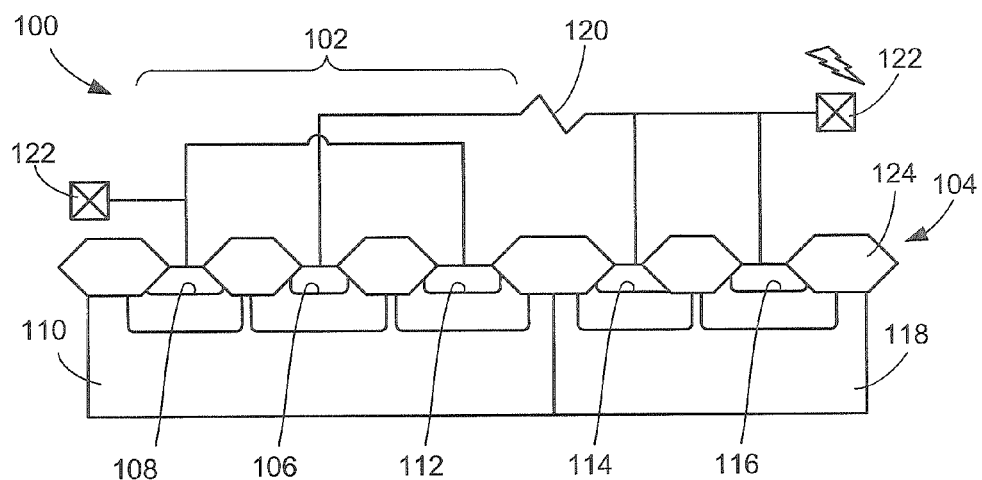
FIG. 1 is a cross-sectional view of a tunable protection system in an embodiment of the present invention.

In the following description, numerous specific details are given to provide a thorough understanding of the invention. However, it will be apparent that the invention may be practiced without these specific details. In order to avoid obscuring the present invention, some well-known circuits, protection configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIG. Similarly, although the sectional views in the drawings for ease of description show the integrated circuits as oriented downward, this arrangement in the FIG. is arbitrary and is not intended to suggest that the integrated circuits should necessarily be fabricated in a downward direction. Generally, the device can be operated in any orientation. The same numbers are used in all the drawing FIG. to relate to the same elements.

The term "horizontal" as used herein is defined as a plane parallel to the conventional plane or surface of the lead frame, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a tunable protection system 100 in an embodiment of the present invention. The tunable protection system 100 includes a tunable trigger device 102 and a circuit protection device 104. The tunable trigger device 102 is formed in a lateral manner including a tunable junction 106, a first junction 108 electrically equivalent to a first body 110 and a second junction 112. The tunable junction 106 is designed to tune or adjust an activation level of the tunable trigger device 102. The activation level is tuned or adjusted independently from the circuit protection device 104 and designed to activate at a level predetermined to protect internal integrated circuits (not shown).

The tunable trigger device 102 is an N-P-N bipolar junction transistor, although it is understood that other configurations may be used, as well. Further, it is understood that the tunable trigger device 102 may be formed of different materials, dopants or implants, as well.

The activation of the tunable trigger device 102 activates the circuit protection device 104. The circuit protection device 104 is formed in a lateral manner including a third junction 114, a fourth junction 116 electrically equivalent to a second body 118, the first junction 108 electrically equivalent to the first body 110, and the second junction 112. When activated, the circuit protection device 104 provides an electrically conductive path for electrical transients, such as electrostatic discharge. When not activated, the circuit protection device 104 provides a highly resistive path that does not interfere with the normal operation of the internal integrated circuits (not shown). A series resistor 120 electrically connects the tunable junction 106 and an input/output pad 122 to protect the tunable junction 106 during activation. An insulator 124, such as thick or field oxide, is shown to laterally insulate conductive regions.

The circuit protection device 104 is a P-N-P-N silicon-controlled rectifier, although it is understood that other configurations may be used, as well. Further, it is understood that the circuit protection device 104 may be formed of different materials, dopants or implants, as well.

Figure 2:
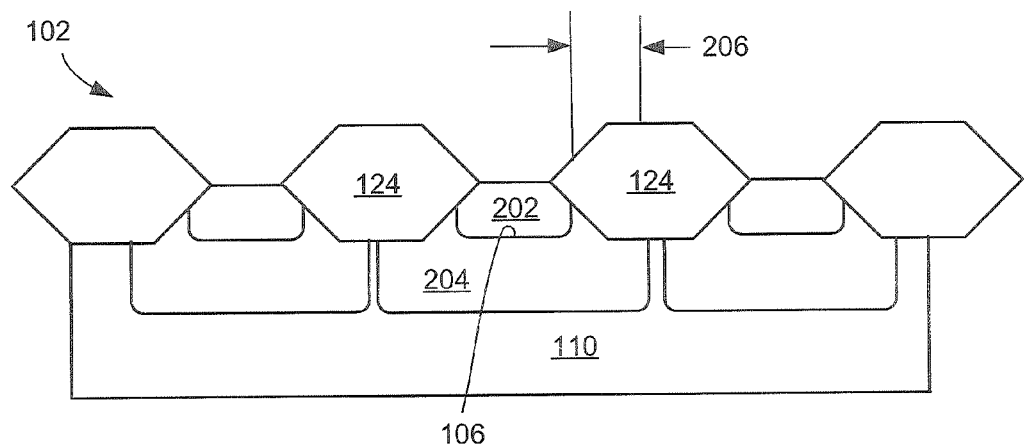
FIG. 2 is a cross-sectional view of the tunable junction of the tunable trigger device as shown in FIG. 1.

Referring now to FIG. 2, therein is shown a cross-sectional view of the tunable junction 106 of the tunable trigger device 102 as shown in FIG. 1. A trigger active area 202 is formed in a trigger junction body 204, the trigger active area 202 surrounded by the trigger junction body 204 on all sides and bottom. An overlap 206 formed by the trigger junction body 204 overlapping the trigger active area 202 provides an activation resistance for the tunable junction 106. An increase in overlap provides an increase in the activation resistance wherein the activation level is also increased. Alternatively, a decrease in overlap provides a decrease in the activation resistance wherein the activation level is also decreased. Thus the activation level is tuned or adjusted to activate at a level predetermined to protect the internal integrated circuits (not shown).

The tunable junction 106 is an N+ and an N− device, although it is understood that other configurations may be used, as well. Further, the tunable junction 106 may be formed of different materials, dopants or implants, as well.

Figure 3:
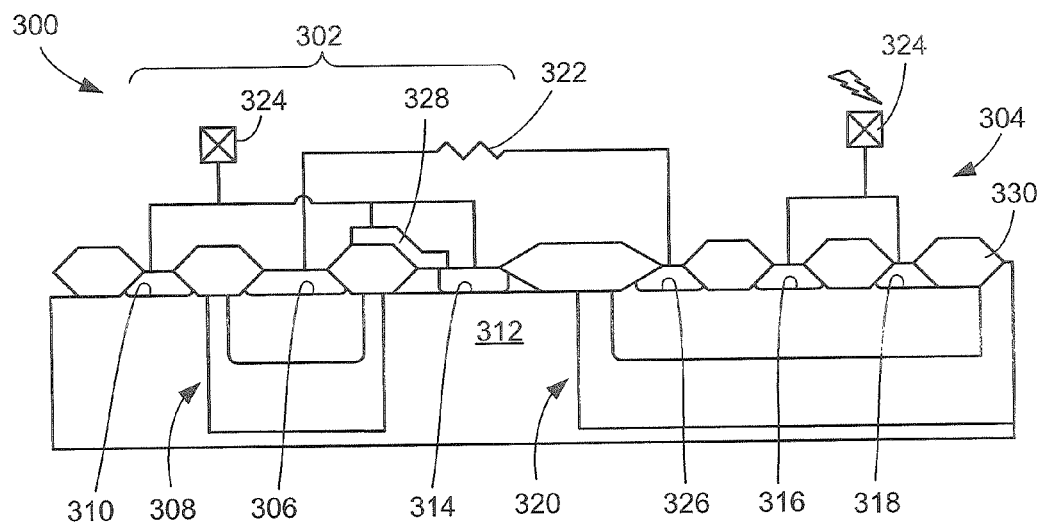
FIG. 3 is a cross-sectional view of a tunable protection system in an alternative embodiment of the present invention.

Referring now to FIG. 3, therein is shown a cross-sectional view of a tunable protection system 300 in an alternative embodiment of the present invention. The tunable protection system 300 includes a tunable trigger device 302 and a circuit protection device 304. The tunable trigger device 302 is formed in a lateral manner including a tunable junction 306, a first junction 310, and a second junction 314. The tunable junction 306 is designed to tune or adjust a breakdown level of the tunable trigger device 302. The trigger level is tuned or adjusted independently from the circuit protection device 304 and designed to activate at a voltage level predetermined to protect the internal integrated circuits (not shown). The tunable junction 306 includes a trigger body structure 308 and the first junction 310 includes a first body 312.

For illustrative purposes the tunable trigger device 302 is shown as an N-P-N bipolar junction transistor, although it is understood that other configurations may be used, as well. Further, it is understood that the tunable trigger device 302 may be formed of different materials, dopants or implants, as well.

The activation of the tunable trigger device 302 activates the circuit protection device 304. The circuit protection device 304 is formed in a lateral manner including a third junction 316, a fourth junction 318, the first junction 310, and the second junction 314. When activated, the circuit protection device 304 provides an electrically conductive path for electrical transients, such as electrostatic discharge. When not activated, the circuit protection device 304 provides a highly resistive path that does not interfere with the normal operation of the internal integrated circuits (not shown). The fourth junction 318 includes a protection body structure 320.

A series resistor 322 electrically connects the tunable junction 306, a fifth junction 326 and an input/output pad 324 to protect the tunable junction 306 during activation. A gate 328, such as a poly plate, may de-activate the circuit protection device 304 after conduction of the electrical transients. An insulator 330, such as thick or field oxide, is shown to laterally insulate conductive regions.

For illustrative purposes the circuit protection device 304 is shown as a P-N-P-N silicon-controlled rectifier, although it is understood that other configurations may be used, as well. Further, it is understood that the circuit protection device 304 may be formed of different materials, dopants or implants, as well.

Figure 4:
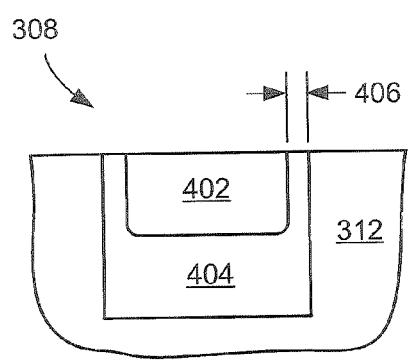
FIG. 4 is a cross-sectional view of the trigger body structure of the circuit protection device as shown in FIG. 3.

Referring now to FIG. 4, therein is shown a cross-sectional view of the trigger body structure 308 of the tunable trigger device 302 as shown in FIG. 3. The trigger body structure 308 further includes a first trigger junction body 402 formed in a second trigger junction body 404. The first trigger junction body 402 is surrounded by the second trigger junction body 404 on all sides and bottom. A trigger overlap 406 formed by the second trigger juction body 404 overlapping the first trigger junction body 402 provides an activation resistance for the trigger body structure 308.

An increase in the trigger overlap 406 provides an increase in the activation resistance wherein the activation level is also increased. Alternatively, a decrease in the trigger overlap 406 provides a decrease in the activation resistance wherein the activation level is also decreased. Thus the activation level is tuned or adjusted to activate at a level predetermined to protect the internal integrated circuits (not shown).

For illustrative purposes the trigger body structure 308 is shown as a low voltage N-well and high voltage N-well device, although it is understood that other configurations may be used, as well. Further, the trigger body structure 308 may be formed of different materials, dopants or implants, as well.

Figure 5:
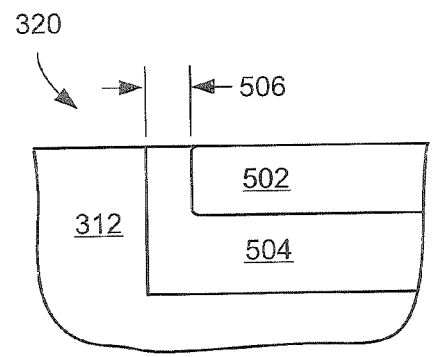
FIG. 5 is a cross-sectional view of the protection body structure of the tunable trigger device as shown in FIG. 3.

Referring now to FIG. 5, therein is shown a cross-sectional view of the protection body structure 320 of the circuit protection device 304 as shown in FIG. 3. A first protection junction body 502 is formed in a second protection junction body 504, the first protection junction body 502 surrounded by the second protection junction body 504 on all sides and bottom. A protection overlap 506 formed by the second protection junction body 504 overlapping the first protection junction body 502 provides a protection resistance for the protection body structure 320.

An increase in the protection overlap 506 provides an increase in the protection resistance wherein the protection level is also increased. Alternatively, a decrease in the protection overlap 506 provides a decrease in the protection resistance wherein the protection level is also decreased. Thus the protection level is tuned or adjusted to activate at a level predetermined to protect the internal integrated circuits (not shown). The protection resistance may be higher than the activation resistance of the trigger body structure 308 of FIG. 3 (not shown) such that an overlap_1, such as a planar dimension of the trigger overlap 406 of FIG. 4 (not shown) is smaller than an overlap_2, such as a planar dimension of the protection overlap 506.

For illustrative purposes the protection body structure 320 is shown as a low voltage N-well and high voltage N-well device, although it is understood that other configurations may be used, as well. Further, the protection body structure 320 may be formed of different materials, dopants or implants, as well.

Figure 6:
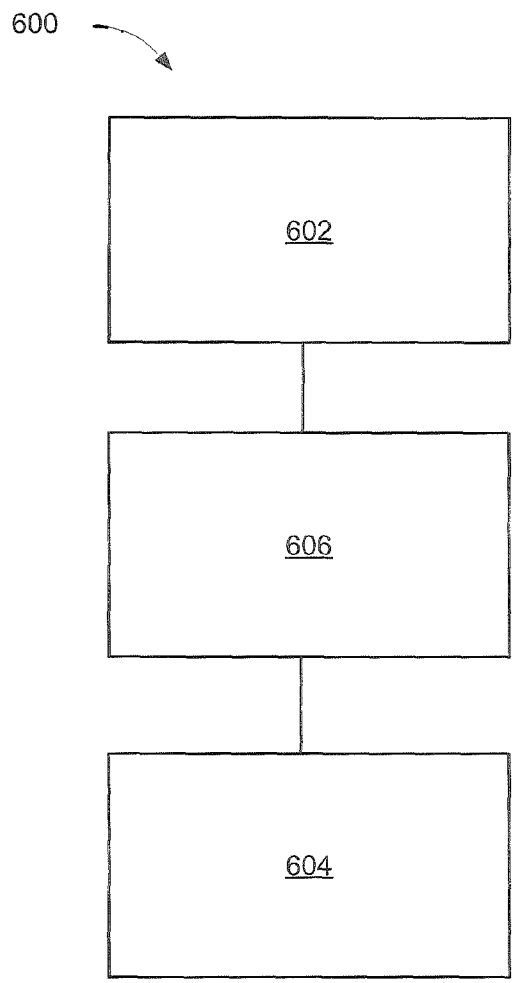
FIG. 6 is a flow chart of a system for tunable protection in an embodiment of the present invention.

Referring now to FIG. 6, therein is shown a flow chart of a system 600 for tunable protection in an embodiment of the present invention. The system 600 includes forming a tunable trigger device providing an adjustable protection activation level in a block 602; forming a circuit protection device providing protection for integrated circuits in a block 604; and electrically connecting the tunable trigger device and the circuit protection device to an input/output pad in a block 606.

In greater detail, a method to fabricate the tunable protection system 100, according to an embodiment of the present invention, is performed as follows:

(1) 1. The tunable trigger device 102 is formed with the trigger junction body 204 overlapping the trigger active area 202 to provide an adjustable protection activation level. (FIG. 1 and FIG. 2)

(2) 2. The circuit protection device 104 is formed in a lateral manner with a set of four physically connected junctions providing an electrically connected path when activated by the tunable trigger 102. (FIG. 1)

(3) 3. The tunable trigger device 102 and the circuit protection device 104 are electrically connected to the input/output pad 122 and activated by the electrical transient. (FIG. 1)

It has been discovered that the present invention thus has numerous advantages.

An advantage is that the present invention provides a tunable trigger circuit for the protection circuitry. The trigger circuit can be tuned to adjustable activation levels, predetermined based upon the circuitry to be protected. This provides a wide range of benefits for the protection of integrated circuits. Multiple fabrication technologies and circuit designs can be addressed by the present invention.

It has been discovered that the disclosed structure provides improved silicon-controlled rectifier performance. The silicon-controlled rectifier is not embedded and can be optimized separately from the trigger and pad circuitry. This allows the silicon-controlled rectifier circuitry to be designed for optimal protection and performance of the internal circuitry without compromising the trigger or pad performance.

It has also been discovered that the disclosed structure improves breakdown voltage performance. The tunable trigger and improved SCR performance allow optimized breakdown voltage levels and performance. These protection devices can be individually designed to predetermined, optimal voltage levels based on the operational and fabrication specifications of the integrated circuit device to be protected.

Yet another discovery of the disclosed structure is the improvement in the parasitic bipolar device due to the elimination of a source side feedback resistor. This series resistor often used in protection circuitry, inhibits and delays the activation of the parasitic bipolar device. The disclosed structure utilizes a protective series resistor that allows the parasitic bipolar device to be activated at the correct level and in a timely manner.

Yet another discovery of the disclosed structure is a more compact layout. The separate protection circuits allow optimization in circuit area. Without the need for embedded circuitry, each circuit need only be designed for its unique function. Each circuit can be optimized for performance and provide a more compact layout. Further, the use of a silicon-controlled rectifier circuit also contributes to a more compact layout.

These and other valuable aspects of the present invention consequently further the state of the technology to at least the next level.

Thus, it has been discovered that the tunable protection system method and apparatus of the present invention furnish important and heretofore unknown and unavailable solutions, capabilities, and functional advantages for protection systems. The resulting processes and configurations are straightforward, cost-effective, uncomplicated, highly versatile and effective, can be implemented by adapting known technologies, and are thus readily suited for efficiently and economically manufacturing integrated circuit package devices.

The resulting processes and configurations are straightforward, cost-effective, uncomplicated, highly versatile and effective, can be implemented by adapting known technologies, and are thus readily suited for efficiently and economically manufacturing protection devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto fore set forth herein or shown in the accompanying drawings are to be interpreted in an illustrative and non-limiting sense.

What is claimed is:

1. A tunable protection method comprising:
    forming a tunable trigger device having a trigger junction body overlapping a trigger active area to provide a trigger overlap, the tunable trigger device having the trigger overlap adjustable for providing an adjustable protection activation level;
    forming a circuit protection device having a protection body overlapping a protection active area to provide a protection overlap, the circuit protection device having the protection overlap adjustable for providing an adjustable protection level for integrated circuits; and
    connecting electrically the tunable trigger device and the circuit protection device to an input/output pad.

2. The method as claimed in claim 1 wherein forming the tunable trigger device comprises increasing and decreasing the trigger overlap to respectively increase and decrease activation resistance to tune the tunable trigger device.

3. The method as claimed in claim 1 wherein forming the tunable trigger device comprises forming a tunable bipolar junction transistor.

4. The method as claimed in claim 1 wherein forming the circuit protection device comprises forming a silicon-controlled rectifier.

5. The method as claimed in claim 1 wherein connecting electrically the tunable trigger device and the circuit protection device to an input/output pad, comprises connecting electrically a series resistor between the tunable trigger device and the input/output pad.

6. A tunable protection method comprising:
    forming a tunable trigger device having a trigger junction body overlapping a trigger active area to provide an overlap, the tunable trigger device providing an adjustable protection activation level by adjusting the overlap;

forming a circuit protection device having a protection body overlapping a protection active area to provide an overlap, the circuit protection device providing an adjustable protection level for integrated circuits by adjusting the overlap; and connecting electrically the tunable trigger device and the circuit protection device to an input/output pad.

7. The method as claimed in claim 6 wherein forming the tunable trigger device comprises increasing and decreasing the trigger overlap to respectively increase and decrease activation resistance to tune the tunable trigger device.

8. The method as claimed in claim 6 wherein forming the circuit protection device comprises increasing and decreasing the protection overlap to respectively increase and decrease protection resistance for protecting the integrated circuits.

9. The method as claimed in claim 6 wherein forming the tunable trigger device comprises forming a tunable bipolar junction transistor configured in the form of an NPN device or a PNP device.

10. The method as claimed in claim 6 wherein forming the circuit protection device comprises forming a silicon-controlled rectifier configured in the form of a PNPN device or an NPNP device.

11. A tunable protection system comprising:
a tunable trigger device having a trigger junction body overlapping a trigger active area to provide a trigger overlap, the tunable trigger device having the trigger overlap adjustable for providing an adjustable protection activation level; and
a circuit protection device having a protection body overlapping a protection active area to provide a protection overlap, the circuit protection device having the protection overlap adjustable for providing protection for integrated circuits, and wherein the tunable trigger device and the circuit protection device are connected electrically to an input/output pad.

12. The system as claimed in claim 11 the wherein the tunable trigger device comprises an increased trigger overlap to provide increased activation resistance to tune the tunable trigger device.

13. The system as claimed in claim 11 wherein the tunable trigger device comprises a tunable bipolar junction transistor.

14. The system as claimed in claim 11 wherein the circuit protection device comprises a silicon-controlled rectifier.

15. The system as claimed in claim 11 wherein the tunable trigger device and the circuit protection device are connected electrically to an input/output pad comprises a series resistor connected electrically between the tunable trigger device and the input/output pad.

16. A tunable protection system comprising:
a tunable trigger device having a trigger junction body overlapping a trigger active area to provide a trigger overlap, the tunable trigger device providing an adjustable protection activation level wherein the trigger overlap is adjusted; and
a circuit protection device having a protection body overlapping a protection active area to provide a protection overlap, the circuit protection device providing an adjustable protection level for integrated wherein the protection overlap is adjusted and wherein the tunable trigger device and the circuit protection device are connected electrically to an input/output pad.

17. The system as claimed in claim 16 wherein the tunable trigger device is adjusted by increased and decreased trigger overlap to respectively provide increased and decreased activation resistance to tune the tunable trigger device.

18. The system as claimed in claim 16 wherein the circuit protection device is adjusted by increased and decreased protection overlap to respectively provide increase and decreased protection resistance to protect the integrated circuits.

19. The system as claimed in claim 16 wherein the tunable trigger device comprises a tunable bipolar junction transistor configured in the form of an NPN device or a PNP device.

20. The system as claimed in claim 16 wherein the circuit protection device comprises a silicon-controlled rectifier configured in the form of a PNPN device or an NPNP device.

\* \* \* \* \*